United States Patent
Jung et al.

(10) Patent No.: US 11,081,736 B2
(45) Date of Patent: Aug. 3, 2021

(54) TEST CELL WITH HIGH RELIABILITY IN ELECTRODE CHARACTERISTIC TEST

(71) Applicant: LG CHEM, LTD., Seoul (KR)

(72) Inventors: Hye Ran Jung, Daejeon (KR); Young Geun Choi, Daejeon (KR); Song Taek Oh, Sejong (KR)

(73) Assignee: LG Chem, Ltd.

( * ) Notice: Subject to any disclaimer, the term of this patent is extended or adjusted under 35 U.S.C. 154(b) by 47 days.

(21) Appl. No.: 16/082,840

(22) PCT Filed: Aug. 23, 2017

(86) PCT No.: PCT/KR2017/009206
§ 371 (c)(1),
(2) Date: Sep. 6, 2018

(87) PCT Pub. No.: WO2018/038529
PCT Pub. Date: Mar. 1, 2018

(65) Prior Publication Data
US 2019/0089021 A1    Mar. 21, 2019

(30) Foreign Application Priority Data

Aug. 23, 2016 (KR) .................. 10-2016-0106913
Aug. 22, 2017 (KR) .................. 10-2017-0106290

(51) Int. Cl.
*H01M 10/48*     (2006.01)
*H01M 4/00*      (2006.01)
(Continued)

(52) U.S. Cl.
CPC .......... *H01M 10/48* (2013.01); *G01R 19/165* (2013.01); *G01R 31/382* (2019.01);
(Continued)

(58) Field of Classification Search
CPC ........ H01M 10/48; H01M 10/44; H01M 4/00; H01M 2004/021; G01R 31/382; G01R 31/3865; G01R 31/392; G01R 19/165
See application file for complete search history.

(56) References Cited

U.S. PATENT DOCUMENTS 5,814,420 A * 9/1998 Chu ...................... C07C 227/32
                                                      136/238
8,586,222 B2   11/2013 Timmons et al.
(Continued)

FOREIGN PATENT DOCUMENTS

CN         103250301 A      8/2013
EP           2442400 A1     4/2012
(Continued)

OTHER PUBLICATIONS

International Search Report for PCT/KR2017/009206 (PCT/ISA/210) dated Dec. 15, 2017.
(Continued)

*Primary Examiner* — Miriam Stagg
*Assistant Examiner* — Lilia Nedialkova
(74) *Attorney, Agent, or Firm* — Lerner, David, Littenberg, Krumholz & Mentlik, LLP (57) ABSTRACT

The present disclosure provides a test cell for measuring electrode characteristics including an electrode assembly having a first reference electrode, a second reference electrode, and a first electrode, which is a target of characteristic measurement, wherein the electrode assembly is housed and sealed in a pouch type battery case made of a laminate sheet with an electrolyte solution.

6 Claims, 4 Drawing Sheets

(51) Int. Cl.
  *G01R 31/392* (2019.01)
  *G01R 31/385* (2019.01)
  *G01R 19/165* (2006.01)
  *G01R 31/382* (2019.01)
  *H01M 10/44* (2006.01)
  *H01M 4/02* (2006.01)
  *H01M 10/0525* (2010.01)

(52) U.S. Cl.
  CPC ....... *G01R 31/3865* (2019.01); *G01R 31/392* (2019.01); *H01M 4/00* (2013.01); *H01M 10/44* (2013.01); *H01M 10/0525* (2013.01); *H01M 2004/021* (2013.01)

(56) References Cited

U.S. PATENT DOCUMENTS

| | | | | |
|---|---|---|---|---|
| 2002/0039680 | A1* | 4/2002 | Hwang | H01M 4/136 |
| | | | | 429/218.1 |
| 2011/0250478 | A1 | 10/2011 | Timmons et al. | |
| 2013/0323542 | A1 | 12/2013 | Wijayawardhana et al. | |
| 2014/0023888 | A1 | 1/2014 | Fulop et al. | |
| 2017/0012325 | A1* | 1/2017 | Zhu | H01M 4/75 |
| 2017/0250447 | A1* | 8/2017 | Jiang | H01M 10/045 |
| 2019/0072613 | A1* | 3/2019 | Schmidt | G01R 31/382 |

FOREIGN PATENT DOCUMENTS

| | | |
|---|---|---|
| JP | 2000-200625 A | 7/2000 |
| JP | 2010-040406 A | 2/2010 |
| JP | 2014-130775 A | 7/2014 |
| JP | 2014-207174 A | 10/2014 |
| JP | 2015-065096 A | 4/2015 |
| JP | 2015-072875 A | 4/2015 |
| KR | 10-2016-0039474 A | 4/2016 |
| WO | 2012049201 A1 | 4/2012 |
| WO | WO 2015/077669 A1 | 5/2015 |
| WO | WO 2015/127442 A1 | 8/2015 |

OTHER PUBLICATIONS

Extended European Search Report corresponding to European Patent Application No. 17843949, dated Mar. 8, 2019, 5 pages.

* cited by examiner

TEST CELL WITH HIGH RELIABILITY IN ELECTRODE CHARACTERISTIC TEST

TECHNICAL FIELD

The present disclosure relates to a test cell with high reliability in an electrode characteristic test.

BACKGROUND

As the technical development of and the demand on mobile devices increase, the demand on a secondary battery as an energy source has rapidly increased, and a lot of research has been conducted on secondary battery cells that can meet various demands.

In particular, there is a high demand for lithium secondary battery cells, such as lithium ion batteries, lithium ion polymer batteries and the like, which have advantages such as high energy density, discharge voltage, output stability, and the like.

Further, potential, output, and capacity of an electrode need to be measured during development of a new battery cell or to check performance of a manufactured battery cell. The measurement may be performed at an electrode development stage or performed to distinguish quality of mass produced electrodes.

Generally, after preparing coin cells in which a pure lithium electrode, which has various already known characteristics such as electrode potential and electrode resistance and enables accurate measurement of characteristics, is combined with an electrode, which is a target of characteristic measurement, a performance test of the electrode is performed by measuring lifespan characteristics, output characteristics, and capacity characteristics of the electrode while repeatedly charging and discharging the prepared coin cell.

However, even in such a test, as charging and discharging are repeated, the reliability of a measured value is low due to the following problems.

First, as charging and discharging are repeated, reversibility of the lithium electrode may decrease and an error may occur in the characteristics of the measured electrode.

Second, a can-type battery case used in producing a coin cell has its own high resistance, and thus accurately confirming output characteristics may be difficult.

Therefore, there is a high need for a technique capable of measuring electrode characteristics with high reliability.

DISCLOSURE

Technical Problem

The present disclosure is provided to solve the above-described problems of the related art and technical problems which were identified in the past.

Specifically, it is an object of the present disclosure to provide a test cell capable of minimizing measurement errors of electrode characteristics by using a second reference electrode configured to measure changes in lithium electrode characteristics and highly accurately confirm the output characteristics due to a low resistance unlike a conventional coin cell.

Technical Solution

The present disclosure provides a test cell for measuring electrode characteristics including an electrode assembly having a first reference electrode, a second reference electrode, and a first electrode, which is a target of characteristic measurement, wherein the electrode assembly is housed and sealed in a pouch type battery case made of a laminate sheet with an electrolyte solution.

In the test cell according to the present disclosure, a battery case may be made of a laminate sheet having a relatively low contact resistance instead of a can-type battery case having a high resistance, and thus a resistance due to the battery case is lower than that of a conventional coin cell, thereby more accurately confirming output characteristics.

The test cell may have a double check system configured to confirm characteristics of the electrodes through the first reference electrode and the second reference electrode, which is advantageous in that errors in characteristic measurement of the electrodes are remarkably low, as will described below.

As one specific example, in the test cell according to the present disclosure, an output characteristic and a capacity characteristic of the first electrode may be measured through an electrochemical reaction of the first reference electrode and the first electrode, and a change in electrochemical characteristics of the first reference electrode and the first electrode may be confirmed through the second reference electrode.

The test cell of the present disclosure may have a double check system in which the change in the electrochemical characteristics of the first reference electrode and the first electrode may be confirmed through the second reference electrode and the electrochemical characteristics of the first electrode may be confirmed through the first reference electrode. Therefore, the change in the electrochemical characteristics of the first reference electrode may be reflected in real time on various characteristics of the first reference electrode to predict an error or a mistake in the output characteristics and the capacity characteristics of the first electrode.

Since the electrochemical reaction of the second reference electrode and the first electrode may be negligible, the change in the electrochemical characteristic of the second reference electrode may not be greatly reflected in a determination of the characteristics of the first reference electrode or the first electrode.

Due to the above characteristics, the characteristics of the first electrode may be more accurately confirmed when the number of cycles is large regardless of the characteristic change in the first reference electrode, and thus the test cell of the present disclosure may provide a highly reliable measurement value.

This is significant in that it is possible to accurately confirm a lifespan and capacity characteristics of only the electrode to be measured even though performance of the test cell itself deteriorates after many cycles.

In the present disclosure, the first reference electrode may be a lithium electrode made of pure lithium, and the pure lithium may form a plate type electrode.

The second reference electrode may have a structure in which an electrode active material is coated on a body having a wire structure made of copper (Cu) or aluminum (Al), and the test cell may be sealed by a battery case in a state in which a part of a wire of the second reference electrode is led to the outside of the cell case.

In the test cell according to the present disclosure, the second reference electrode is disposed between the first reference electrode and the first electrode, and thus a relative potential of each of the first reference electrode and the second reference electrode may be measured. Also, the change in the electrochemical characteristics of the first reference electrode may be accurately confirmed by measuring the relative potential of the first reference electrode at a position in which an actual electrochemical reaction occurs.

Since the second reference electrode is disposed between the first reference electrode and the first electrode in a wire structure having a small volume, an overall volume of the battery cell due to the second reference electrode is not increased and a surface area thereof is also small, and thus a contact resistance may be low.

The second reference electrode may have a wire structure extending outwardly from the inside of the test cell, and a user may easily measure the relative potential by connecting a potential measuring device to the second reference electrode on an outer side of the test cell, and the test cell may be used in a state in which the extending wire is cut as necessary.

The electrode active material constituting the second reference electrode may have a stable material which may be low in reactivity with the electrolytic solution, slow in degradation of the electrode, and does not hinder reversibility of lithium ions. Specifically, the electrode active material may be lithium titanium oxide (LTO) having a high structural stability and slow electrode degradation, but the material is not limited thereto as long as the material has a constant voltage range within a wide capacity range so that the material can be used as a reference electrode.

In the present disclosure, the first reference electrode may act as a negative electrode for the first electrode and the second reference electrode, and the second reference electrode may act as a reference electrode for the first reference electrode and the first electrode. In other words, in the test cell of the present disclosure, the first electrode may act only as a positive electrode, and the second reference electrode may act as a reference electrode for the first reference electrode and the first electrode. An electrochemical reaction of the second reference electrode in the test cell may be negligible and may have little effect on the capacity or lifespan of the actual test cell.

The second reference electrode may measure the relative potential of each of the first electrode and the first reference electrode inside the test cell.

In one specific example, the electrode assembly may have a structure in which the first reference electrode, a first separator, the second reference electrode, a second separator, and the first electrode may be sequentially laminated.

The present disclosure also provides a method of measuring a characteristic of a first electrode using the test cell: the method including: (i) measuring output and capacity characteristics of the test cell at intervals of 10 cycles to 100 cycles while the test cell is charged and discharged repeatedly; (ii) further measuring a change in an electrode potential of a first reference electrode with respect to a second reference electrode during the measurement process of the process (i); and (iii) correcting the measured value of the output and capacity characteristics in the process (i) on the basis of the change in the electrode potential of the first reference electrode.

The test cell according to the present disclosure may have a double check system in which a change in electrochemical characteristics of the first reference electrode and the first electrode may be confirmed through the second reference electrode and electrochemical characteristics of the first electrode may be confirmed through the first reference electrode. Therefore the change in the electrochemical characteristics of the first reference electrode may be reflected in real time on various characteristics of the first reference electrode to predict an error or a mistake in the output and capacity characteristics of the first electrode.

As a result, the method of the present disclosure may more accurately confirm the characteristics of the first electrode regardless of the number of cycles, and more accurately measure the electrode characteristics of the first electrode.

Internal resistance of the test cell may be $0.5\Omega$ to $5\Omega$.

That may be a resistance which is approximately 10 to 100 times lower than that of a coin cell made of a can type cell case, and thus more accurate output characteristics of the electrode based on those characteristics may be confirmed.

In the test cell of the present disclosure, the first electrode may be an electrode configured to form a positive electrode or negative electrode in a lithium secondary battery.

In one specific example, the first electrode may be prepared by applying a mixture of a positive active material, a conductive material, and a binder to a positive electrode current collector, and then the mixture may be dried, and a filler may be further added to the mixture as necessary.

The positive electrode current collector generally has a thickness of about 3 to 500 μm. The positive electrode current collector and an extensible current collect part are not particularly restricted so long as they exhibit high conductivity while they do not induce any chemical change in a battery to which they are applied. Examples of the positive electrode current collector and the extensible current collect part may include stainless steel, aluminum, nickel, titanium, baked carbon, or aluminum or stainless steel surface-treated with carbon, nickel, titanium, silver, etc. The positive electrode current collector and the extensible current collect part may have fine irregularities on the surface thereof to increase an adhesive force of the positive electrode active material, and may have various shapes such as a film, a sheet, a foil, a net, a porous body, a foam, and a non-woven fabric, etc.

Examples of the positive electrode active material may include, for example, a layered compound of lithium cobalt oxide ($LiCoO_2$), lithium nickel oxide ($LiNiO_2$), etc. or a substituted compound with one or more transition metals; lithium manganese oxide such as $Li_{1+x}Mn_{2-x}O_4$ (in which x is 0 to 0.33), $LiMnO_3$, $LiMn_2O$, $LiMnO_2$, etc.; lithium copper oxide ($Li_2CuO_2$); vanadium oxide such as $LiV_3O_8$, $LiFe_3O_4$, $V_2O_5$, $CuZV_2O_7$, etc.; Ni site-type lithium nickel oxide represented by Chemical Formula of $LiNi1-xMxO_2$ (in which, M=Co, Mn, Al, Cu, Fe, Mg, B or Ga, x=0.01 to 0.3); lithium manganese complex oxide represented by Chemical Formula $LiMn_2-xMxO_2$ (in which M=Co, Ni, Fe, Cr, Zn or Ta, and x=0.01 to 0.1) or $Li_2Mn_3MO_8$ (in which, M=Fe, Co, Ni, Cu or Zn); $LiMn_2O_4$ in which a portion of Li is substituted with alkaline earth metal ions; a disulfide compound; $Fe_2(MoO_4)_3$, and the like. However, the present disclosure may not be limited thereof.

The conductive agent is generally added so that the conductive agent has 1 to 30 wt % based on the total weight of the compound including the positive electrode active material. The conductive agent is not particularly restricted so long as the conductive agent exhibits high conductivity while the conductive agent does not induce any chemical change in a battery to which the conductive agent is applied. For example, graphite, such as natural graphite or artificial graphite; carbon black, such as carbon black, acetylene black, Ketjen black, channel black, furnace black, lamp black, thermal black; conductive fiber, such as carbon fiber or metallic fiber; metallic powder, such as carbon fluoride powder, aluminum powder, or nickel powder; conductive whisker, such as zinc oxide or potassium titanate; conductive metal oxide, such as titanium oxide; or polyphenylene derivatives may be used as the conductive agent.

The binder is a component assisting in binding between the active material and conductive agent and in binding with the current collector. The binder is generally added in an amount of 1 to 30 wt % based on the total weight of the compound including the positive electrode active material. As examples of the binder, there may be used polyvinylidene fluoride, polyvinyl alcohol, carboxymethylcellulose (CMC), starch, hydroxypropylcellulose, regenerated cellulose, polyvinyl pyrollidone, tetrafluoroethylene, polyethylene, polypropylene, ethylene-propylene-diene terpolymer (EPDM), sulfonated EPDM, styrene butadiene rubber, fluoro rubber, and various copolymers.

The filler is an optional component used to inhibit expansion of the positive electrode. There is no particular limit to the filler so long as the filler does not cause chemical changes in a battery to which the filler is applied, and is made of a fibrous material. As examples of the filler, there may be used olefin polymers, such as polyethylene and polypropylene; and fibrous materials, such as glass fiber and carbon fiber.

In another specific example, the first electrode may be prepared by applying and drying a negative electrode active material to a negative electrode current collector. Optionally, the above-mentioned components may be selectively added to the negative electrode active material as needed.

The negative electrode current collector generally has a thickness of about 3 to 500 µm. The negative electrode current collector and/or an extensible current collect part are not particularly restricted so long as they exhibit high conductivity while they do not induce any chemical change in a battery to which they are applied. Examples of the negative electrode current collector and the extensible current collect part may include copper, stainless steel, aluminum, nickel, titanium, baked carbon, or copper or stainless steel surface-treated with carbon, nickel, titanium, silver, etc., aluminum-cadmium ally, etc. Further, similarly to the positive electrode current collector, the negative electrode current collector and/or the extensible current collect part may have fine irregularities on the surface thereof to increase an adhesive force of the negative electrode active material, and may have various shapes such as a film, a sheet, a foil, a net, a porous body, a foam, and a non-woven fabric, etc.

As the negative electrode active material, for example, there may be used carbon, such as non-graphitizing carbon or a graphite-based carbon; a metal composite oxide, such as $Li_xFe_2O_3$ ($0 \leq x \leq 1$), $Li_xWO_2$ ($0 \leq x \leq 1$), $Sn_x$, $Me_{1-x}Me'_yO_z$ (Me: Mn, Fe, Pb, Ge; Me': Al, B, P, Si, Group 1, 2 and 3 elements of the periodic table, halogen; $0 \leq x \leq 1$; $1 \leq y \leq 3$; $1 \leq z \leq 8$); lithium metal; lithium alloy; silicon-based alloy; tin-based alloy; a metal oxide, such as $SnO$, $SnO_2$, $PbO$, $PbO_2$, $Pb_2O_3$, $Pb_3O_4$, $Sb_2O_3$, $Sb_2O_4$, $Sb_2O_5$, $GeO$, $GeO_2$, $Bi_2O_3$, $Bi_2O_4$, or $Bi_2O_5$; conductive polymer, such as polyacetylene; or a Li—Co—Ni based material.

The separator is interposed between the positive electrode and the negative electrode, and an insulating thin film having high ion permeability and mechanical strength is used. A pore diameter of the separator is generally 0.01 to 10 µm, and a thickness thereof is generally 5 to 300 µm. For example, in addition to the organic/inorganic composite porous safety-reinforcing saparators (SRS), there may be used olefin-based polymers such as polypropylene, which is chemically resistant and hydrophobic; a sheet or a non-woven fabric made of glass fiber, polyethylene or the like may be used as an example of the separator. When a solid electrolyte such as a polymer is used as the electrolyte, the solid electrolyte may also serve as a separator.

The electrolytic solution may be a non-aqueous electrolytic solution containing a lithium salt, and may include a non-aqueous electrolytic solution and a lithium salt. Examples of the non-aqueous electrolytic solution may include non-aqueous organic solvent, organic solid electrolyte, inorganic solid electrolyte, etc., but may not be limited thereto.

As examples of the non-aqueous organic solvent, mention may be made of non-protic organic solvents, such as N-methyl-2-pyrollidinone, propylene carbonate, ethylene carbonate, butylene carbonate, dimethyl carbonate, diethyl carbonate, gamma-butyro lactone, 1,2-dimethoxy ethane, tetrahydroxy Franc, 2-methyl tetrahydrofuran, dimethylsulfoxide, 1,3-dioxolane, formamide, dimethylformamide, dioxolane, acetonitrile, nitromethane, methyl formate, methyl acetate, phosphoric acid triester, trimethoxy methane, dioxolane derivatives, sulfolane, methyl sulfolane, 1,3-dimethyl-2-imidazolidinone, propylene carbonate derivatives, tetrahydrofuran derivatives, ether, methyl propionate, and ethyl propionate.

As examples of the organic solid electrolyte, mention may be made of polyethylene derivatives, polyethylene oxide derivatives, polypropylene oxide derivatives, phosphoric acid ester polymers, poly agitation lysine, polyester sulfide, polyvinyl alcohols, polyvinylidene fluoride, and polymers containing ionic dissociation groups.

As examples of the inorganic solid electrolyte, mention may be made of nitrides, halides, and sulphates of lithium (Li), such as $Li_3N$, $LiI$, $Li_5NI_2$, $Li_3N$—$LiI$—$LiOH$, $LiSiO_4$, $LiSiO_4$—$LiI$—$LiOH$, $Li_2SiS_3$, $Li_4SiO_4$, $Li_4SiO_4$—$LiI$—$LiOH$, and $Li_3PO_4$—$Li_2S$—$SiS_2$.

The lithium salt is a material that is readily soluble in the above-mentioned non-aqueous electrolyte, and may include, for example, $LiCl$, $LiBr$, $LiI$, $LiClO_4$, $LiBF_4$, $LiB_{10}Cl_{10}$, $LiPF_6$, $LiCF_3SO_3$, $LiCF_3CO_2$, $LiAsF_6$, $LiSbF_6$, $LiAlCl_4$, $CH_3SO_3Li$, $CF_3SO_3Li$, $(CF_3SO_2)_2NLi$, chloroborane lithium, lower aliphatic carboxylic acid lithium, lithium tetraphenyl borate, and imide.

In addition, in order to improve charge and discharge characteristics and flame retardancy, for example, pyridine, triethylphosphite, triethanolamine, cyclic ether, ethylenediamine, n-glyme, hexaphosphoric triamide, nitrobenzene derivatives, sulfur, quinone imine dyes, N-substituted oxazolidinone, N,N-substituted imidazolidine, ethylene glycol dialkyl ether, ammonium salts, pyrrole, 2-methoxy ethanol, aluminum trichloride, or the like may be added to the non-aqueous electrolytic solution. According to circumstances, in order to impart incombustibility, the non-aqueous electrolytic solution may further include halogen-containing solvents, such as carbon tetrachloride and ethylene trifluoride. Furthermore, in order to improve high-temperature storage characteristics, the non-aqueous electrolytic solution may further include carbon dioxide gas, and may further include fluoro-ethylene carbonate (FEC), propene sultone (PRS), etc.

In one specific example, a non-aqueous electrolyte containing a lithium salt may be prepared by adding a lithium salt such as $LiPF_6$, $LiClO_4$, $LiBF_4$, $LiN(SO_2CF_3)_2$, etc. to a mixed solvent of a cyclic carbonate of EC or PC, which is a high-dielectric solvent, and a linear carbonate of DEC, DMC or EMC, which is a low viscosity solvent.

Advantageous Effects

As described above, in a test cell according to the present disclosure, a battery case is made of a laminate sheet having a relatively low contact resistance instead of a can-type battery case having a high resistance, and thus resistance due to the battery case is lower than that of a conventional coin cell, thereby more accurately confirming output characteristics.

Further, the test cell has a double check system configured to confirm the characteristics of electrodes on a first reference electrode and a second reference electrode, which is advantageous in that an error in the characteristic measurement of the electrode is remarkably low

DETAILED DESCRIPTION OF THE PREFERRED EMBODIMENTS

Hereinafter, exemplary embodiments of the present disclosure will be described in detail with reference to the drawings, which are for easing understanding of the present disclosure, and the scope of the present disclosure is not limited thereto.

Figure 1:
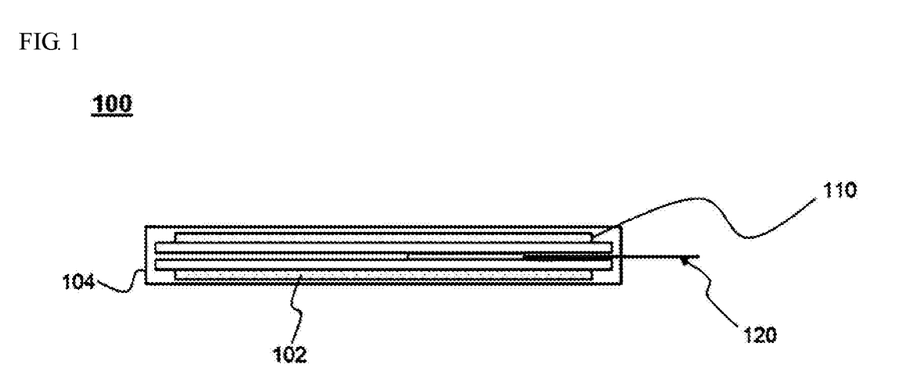
FIG. 1 is a schematic diagram based on a vertical cross section of a test cell according to one embodiment of the present disclosure.
Figure 2:
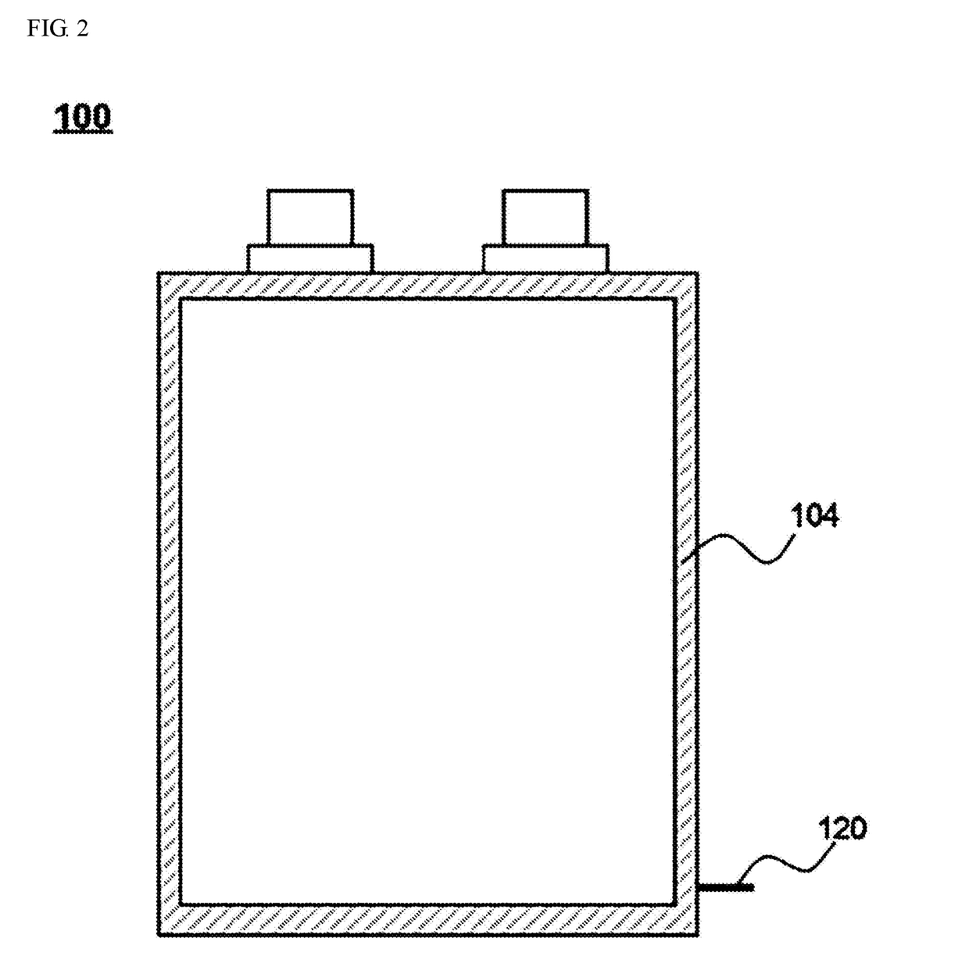
FIG. 2 is a schematic diagram of a top of the test cell.
Figure 3:
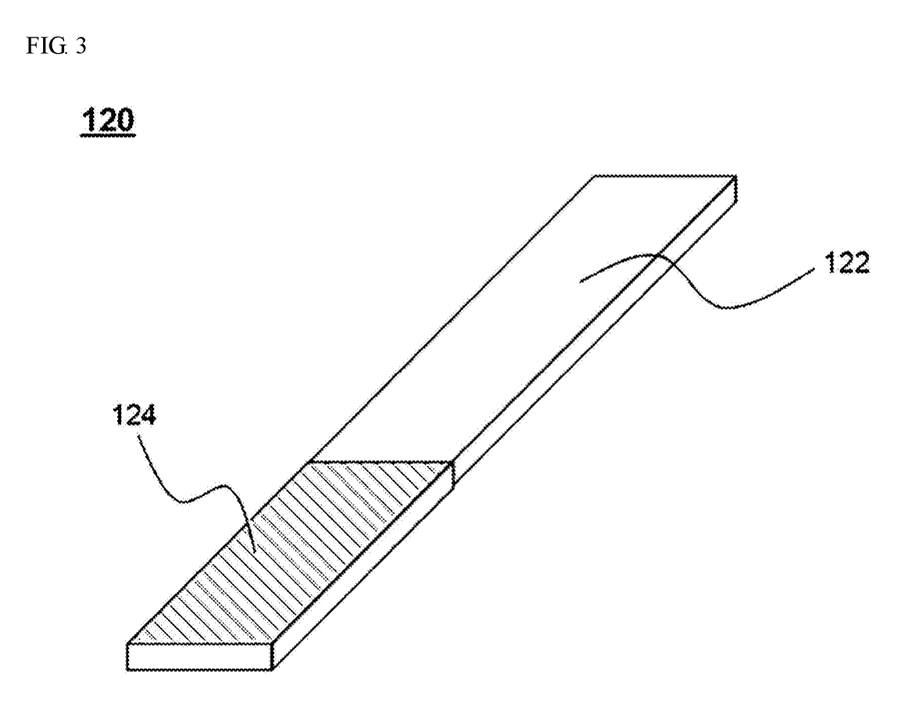
FIG. 3 is a schematic diagram of a second reference electrode.

FIG. 1 is a schematic diagram based on a vertical cross section of a test cell according to one embodiment of the present disclosure, and FIG. 2 is a schematic diagram of a top of the test cell. FIG. 3 is a schematic diagram of a second reference electrode.

Referring to these diagrams, a test cell 100 has a structure in which an electrode assembly including a first reference electrode 110 made of pure lithium, a second reference electrode 120 having a lithium titanium oxide (LTO)-based electrode active material, and a first electrode 102, which is a target of characteristic measurement, is housed and sealed in a pouch type battery case 104 made of a laminate sheet with an electrolyte solution.

That is, in the test cell 100 according to the present disclosure, the battery case 104 is made of a laminate sheet having a relatively low contact resistance instead of a can-type battery case having a high resistance, and thus a resistance due to the battery case 104 is lower than that of a conventional coin cell. This enables more accurate measurement when confirming the output characteristics.

The electrode assembly has a structure in which the first reference electrode 110, a first separator, the second reference electrode 120, a second separator, and the first electrode 102 are sequentially laminated.

The second reference electrode 120 may have a structure in which an electrode active material 124 is coated on a body 122 having a wire structure made of copper (Cu), and the test cell 100 may be sealed by the battery case 104 in a state in which a part of the body 122 having the wire structure of the second reference electrode 120 is led to the outside of the battery case 104.

The second reference electrode 120 is disposed between the first reference electrode 110 and the first electrode 102, and thus a relative potential of each of the first reference electrode 110 and the second reference electrode 120 may be measured. Also, a change in electrochemical characteristics of the first reference electrode 110 may be accurately confirmed by measuring the relative potential of the first reference electrode 110 at a position at which an actual electrochemical reaction occurs.

Further, the second reference electrode 120 has a wire structure extending outwardly from the inside of the test cell 100, and a user may easily measure the relative potential by connecting a potential measuring device to the second reference electrode 120 on an outer side of the test cell 100. In some cases, the test cell 100 may be used in a state in which a wire extending from the inside of the test cell 100 is cut.

In the test cell 100, the first reference electrode 110 acts as a negative electrode for the first electrode 102 and the second reference electrode 120, and the second reference electrode 120 acts as a reference electrode for the first reference electrode 110 and the first electrode 102.

Here, in the test cell 100, output and capacity characteristics of the first electrode 102 may be measured through an electrochemical reaction of the first reference electrode 110 and the first electrode 102, and a change in electrochemical characteristics of the first reference electrode 110 may be confirmed through the second reference electrode 120.

That is, the test cell 100 of the present disclosure is configured as a double check system in which a change in electrochemical characteristics of the first reference electrode 110 is confirmed through the second reference electrode 120 and the electrochemical characteristics of the first electrode 102 are confirmed through the first reference electrode 110.

However, an electrochemical reaction of the second reference electrode 120 and the first electrode 102 in the test cell 100 may be negligible.

Figure 4:
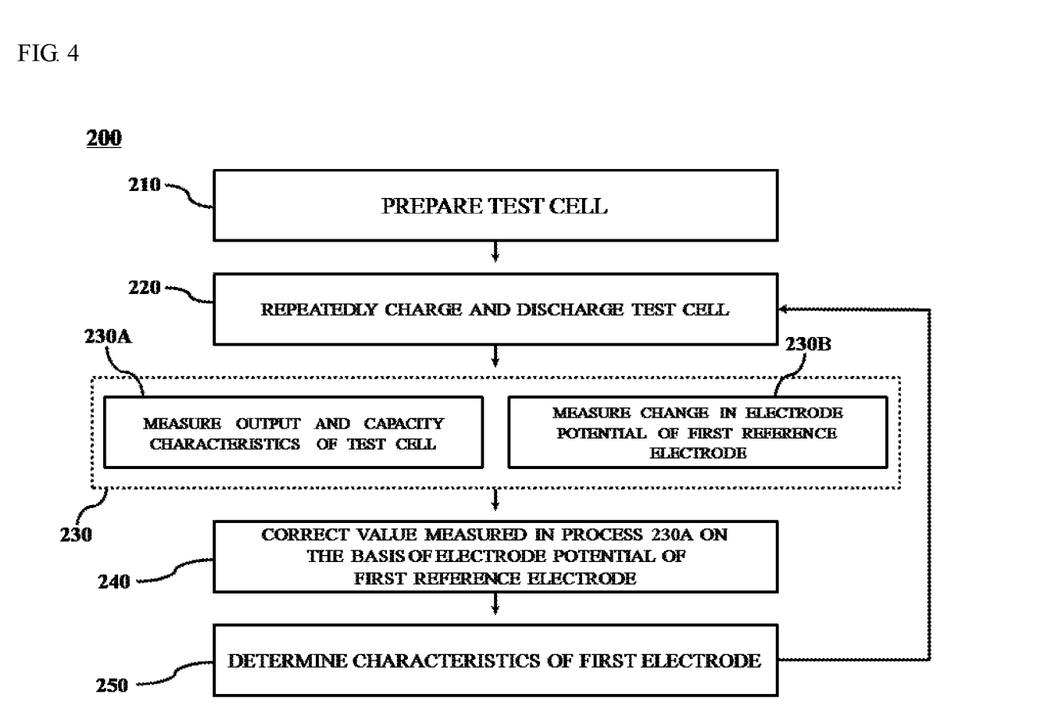
FIG. 4 is a flowchart illustrating a method of using the test cell according to one embodiment of the present disclosure.

Meanwhile, FIG. 4 provides a method of measuring characteristics of the first electrode 102 using the test cell 100. Referring to FIG. 4 with reference to FIGS. 1 to 3, in process 210, an electrode assembly having a structure in which the first reference electrode 110, a first separator, the second reference electrode 120, a second separator, and the first electrode 10 are sequentially laminated is housed in the pouch-shaped battery case 104 together with an electrolyte solution, and then the battery case 104 is sealed to prepare the test cell 100.

The pouch-shaped battery case may be made of a laminate sheet. The laminate sheet may have a multi-layer structure, and may include an outer coating layer configured to form an outermost layer thereof, metal layers configured to prevent a material from passing therethrough, and an inner sealant layer configured to seal the laminate.

The inner sealant layer is formed of a casting polypropylene (CPP) film, and the inner sealant layer and the electrode assembly are thermally fused to each other by heat and pressure being applied while the electrode assembly is embedded to provide sealability.

The metal layers may be formed of aluminum (Al) to exhibit a function of preventing foreign matter from being introduced into or leaking from the battery case. The metal layers may have a structure in which a chromium oxide film is formed on surfaces of the metal layers, and the film is formed by combining chromium contained in the metal layer with oxygen in air to form an oxide film and acts to prevent oxidation and corrosion of the metal layers. Specifically, the chromium oxide film may be made of chromium trivalent oxide ($Cr_2O_3$).

In one specific example, a thickness of the laminate sheet may be from 70 μm to 150 μm, specifically from 80 μm to 140 μm, and more specifically from 100 μm to 130 μm. The thickness of the laminate sheet is a total thickness of a resin layer, at least one metal layer, and the inner sealant layer. Therefore, when the thickness of the laminate sheet is less than 70 μm, the thickness of the metal layers is also reduced proportionally, and thus it may be difficult to protect the battery cell from external impacts. When the thickness of the laminate sheet is greater than 150 μm, the weight and volume of a secondary battery as a whole are increased, and thus a device to which the secondary batter is applied may be limited, which is not desirable.

In one specific example, the laminate sheet may have a single metal layer, and in such a case, the thickness of the metal layer may be in the range of 10 μm to 100 μm, specifically, in the range of 15 μm to 80 μm, which is within the range of the thickness of the laminate sheet described above. When the thickness of the metal layer is less than 10 μm, it may be difficult to achieve an effect in which mechanical strength is improved. When the thickness of the metal layer is greater than 100 μm, the thickness of the laminate sheet is increased, and thus it may be difficult to provide a compact secondary battery, which is not desirable.

In another specific example, the laminate sheet may have two metal layers. In a case in which two metal layers are included in the laminated sheet, it is more preferable for a thin metal layer to be used than in a case in which one laminate sheet is used in order to prevent the overall thickness of the laminate sheet from being increased, and a thickness of the metal layer may be preferably 20 μm to 50 μm, and more specifically, 25 μm to 40 μm.

Meanwhile, an adhesive layer may be further included between the metal layers and between the metal layer and the inner sealant layer to increase a bonding force between layers made of different materials. The adhesive layer may be composed of one or more materials selected from the group consisting of an epoxy-based material, a phenol-based material, a melamine-based material, a polyimide-based material, a polyester-based material, a urethane-based material, a polyethylene terephthalate-based material, and a polyether urethane-based material.

Afterward, in process 220, the test cell 100 is repeatedly charged and discharged, and when an arbitrary cycle in which the number of charge/discharge cycles is selected from 10 to 100 is completed, the process proceeds to process 230.

In process 230, process 230a in which output and capacity characteristics of the test cell 100 are measured and process 230b in which a change in an electrode potential of the first reference electrode 110 is measured are performed.

The order of processes 230a and 230b is unimportant, and the processes may be performed simultaneously.

It is assumed that the characteristic of the test cell 100 measured in process 230a is the characteristic of the first electrode 102, and this assumption is based on a state in which various performances of the first reference electrode 110 made of pure lithium are recognized in advance.

In process 230b, the change in the electrode potential of the first reference electrode 110 is further measured on the basis of the second reference electrode 120 to measure an electrochemical change of the first reference electrode 110.

In this state, the process proceeds to process 240 to correct a value measured in process 230a on the basis of the change in the electrode potential of the first reference electrode 110. As a result, errors or mistakes in the output characteristics and capacity characteristics of the first electrode 102 on the basis of the electrochemical change of the first reference electrode 110 are predicted and reflected.

Accordingly, in subsequent process 250, the characteristics of the first electrode 102 may be determined on the basis of the corrected data.

After the series of processes, when the arbitrary cycle in which the number of charge/discharge cycles is selected from 10 to 100 is completed while performing process 220 again, process 230 to process 250 are sequentially performed to accurately measure a reduction of the output and capacity characteristics of the first electrode 102 according to the cycle.

Hereinafter, the present disclosure will be described in more detail through examples. However, the examples and experimental examples described below are for exemplifying the present disclosure, and the scope of the present disclosure is not limited thereto.

EXAMPLE

Preparation of First Reference Electrode

A plate type pure lithium metal was prepared as a first reference electrode.

Preparation of Second Reference Electrode

A positive electrode mixture slurry prepared by adding 90 wt % of $Li_4Ti_5O_{12}$ as a positive electrode active material, 4 wt % of Denka black as a conductive material, and 6 wt % of polyvinylidene fluoride (PVDF) as a binder to N-methyl-2-pyrrolidone (NMP) was coated on a body having a wire structure made of copper to prepare a second reference electrode.

Preparation of First Electrode

A positive electrode mixture slurry was prepared by adding 96 wt % of $LiNiCoMnO_2$ as a positive electrode active material, 2 wt % of Denka black as a conductive material, and 2 wt % of PVDF as a binder to NMP. The prepared positive electrode mixture slurry was coated on one surface of an aluminum current collector to a thickness of 100 μm, dried and rolled, and then punched to a predetermined size to prepare a first electrode.

Preparation of Three Electrode Test Cell

An electrolyte solution in which 1M lithium hexafluorophosphate ($LiPF_6$) was dissolved was injected into a solvent in which ethylene carbonate (EC) and ethyl methyl carbonate (DEC) were mixed at a volume ratio of 50:50 in an electrode assembly, which had a structure in which the first reference electrode, a first separator (polypropylene-based porous membrane), the second reference electrode, a second separator (polypropylene-based porous membrane), and the first electrode were sequentially laminated. Thereafter, a product was housed in a pouch type battery case made of a laminate sheet, and the battery case was sealed to prepare a test cell.

Comparative Example

A positive electrode mixture slurry was prepared by adding 96 wt % of $LiNiCoMnO_2$ as a positive electrode active material, 2 wt % of Denka black as a conductive material, and 2 wt % of PVDF as a binder to NMP. The prepared positive electrode mixture slurry was coated on one surface of an aluminum current collector to a thickness of 100 μm, dried and rolled, and then punched to a predetermined size to prepare an electrode. A plate type pure lithium metal was prepared as a counter electrode. An electrode assembly in which the prepared electrodes, a separator (polypropylene-based porous membrane), and the prepared counter electrode were sequentially laminated was housed in a can type battery case to prepare a test cell.

Experimental Example 1

Capacity Retention Rate and Capacity Retention Rate Deviation

Capacity retention characteristics when the test cells prepared in Example and Comparative Example were charged and discharged at room temperature (25° C.) under a condition of 0.5 C/2 C within a driving voltage range of 3 to 4.2 V were measured, and are shown in Table 1. A standard deviation of five cells was calculated to obtain a capacity retention rate deviation.

Experimental Example 2

EIS Resistance and Resistance Variation

Interfacial resistance of an EIS was measured with an SOC50. The results are shown in Table 1, and a resistance variation was calculated, and is shown in Table 1. A standard deviation of five cells was calculated to obtain a resistance deviation.

TABLE 1

| | Discharge Capacity Retention Rate | Capacity Retention Rate Deviation | EIS Resistance (ohm · cm$^2$) | Resistance Variation |
|---|---|---|---|---|
| Example | 90 | 0.36 | 3.3 | 0.5 |
| Comparative Example | 85 | 5 | 14.9 | 11 |

As can be seen from the above results, the test cell of Example has much lower capacity retention rate deviation and resistance variation than the test cell of Comparative Example, and thus it can be confirmed that reliability of the electrode characteristic test is high.

It should be understood by those skilled in the art that various changes may be made without departing from the spirit and scope of the present disclosure.

The invention claimed is:

1. A test cell for measuring electrode characteristics, comprising:
   an electrode assembly having a first reference electrode, a second reference electrode, and a first electrode, which is a target of characteristic measurement, the first reference electrode, a first separator, the second reference electrode, a second separator, and the first electrode being sequentially laminated to form the electrode assembly,
   wherein the electrode assembly is housed and sealed in a pouch type battery case made of a laminate sheet with an electrolyte solution,
   wherein the first reference electrode is a lithium electrode made of pure lithium, and the pure lithium forms a plate type electrode, and the first reference electrode does not have an electrode mixture slurry coated thereon,
   wherein the second reference electrode comprises lithium titanium oxide (LTO) coated on a body having a wire structure made of copper (Cu) or aluminum (Al), and a part of a wire of the second reference electrode is led to an outside of the pouch type battery case,
   wherein the first electrode comprises an electrode mixture slurry coated on one surface of an electrode current collector,
   wherein an internal resistance of the test cell ranges from 0.5Ω to 5Ω,
   wherein the test cell is configured to measure an output characteristic and a capacity characteristic of the first electrode through an electrochemical reaction of the first reference electrode and the first electrode, and the test cell is configured to confirm a change in electrochemical characteristics of the first reference electrode by the second reference electrode,
   wherein the test cell is configured to predict an error or mistake with respect to the output characteristic and the capacity characteristic of the first electrode according to the change in electrochemical characteristics of the first reference electrode, and
   wherein the second reference electrode is configured to measure changes in characteristics of the lithium electrode over a plurality of charge/discharge cycles.

2. The test cell of claim 1, wherein the first reference electrode acts as a negative electrode for the first electrode and the second reference electrode.

3. The test cell of claim 1, wherein the second reference electrode acts as a reference electrode for the first reference electrode and the first electrode.

4. The test cell of claim 1, wherein the second reference electrode is configured to measure a relative potential of each of the first electrode and the first reference electrode.

5. A method for measuring a characteristic of the first electrode using the test cell according to claim 1, comprising:
   measuring output and capacity characteristics of the test cell at intervals of 10 cycles to 100 cycles while the test cell is charged and discharged repeatedly;
   further measuring a change in an electrode potential of the first reference electrode with respect to the second reference electrode during the measurement process of the process (i); and
   correcting the measured value of the output and capacity characteristics in the process (i) on the basis of the change in the electrode potential of the first reference electrode.

6. The method of claim 5, further comprising measuring internal resistance of the test cell using electrochemical impedance spectroscopy.

* * * * *